(12) United States Patent
Takasoh

(10) Patent No.: US 7,283,602 B2
(45) Date of Patent: Oct. 16, 2007

(54) HALF-RATE CLOCK AND DATA RECOVERY CIRCUIT

(75) Inventor: Jun Takasoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 716 days.

(21) Appl. No.: 10/801,673

(22) Filed: Mar. 17, 2004

(65) Prior Publication Data

US 2004/0240599 A1    Dec. 2, 2004

(30) Foreign Application Priority Data

May 27, 2003    (JP)    ............................. 2003-148806

(51) Int. Cl.
*H03D 3/24*    (2006.01)
(52) U.S. Cl. ...................... 375/376; 375/354; 375/371; 375/373
(58) Field of Classification Search ................ 375/376, 375/354, 371, 373
See application file for complete search history.

(56) References Cited

U.S. PATENT DOCUMENTS

| 5,559,835 A | * | 9/1996 | Betts ........................... 375/265 |
| 6,118,814 A | * | 9/2000 | Friedman .................... 375/232 |
| 6,225,831 B1 | * | 5/2001 | Dalmia et al. ................ 327/12 |
| 6,396,360 B1 | * | 5/2002 | Cai .......................... 331/108 B |
| 6,877,132 B1 | * | 4/2005 | De et al. ...................... 714/795 |
| 6,956,923 B1 | * | 10/2005 | Younis et al. ................ 375/375 |
| 6,977,959 B2 | * | 12/2005 | Brunn et al. ................. 375/219 |
| 7,103,131 B1 | * | 9/2006 | Byran et al. ................. 375/375 |
| 2002/0097075 A1 | * | 7/2002 | Ono et al. ................... 327/175 |
| 2003/0142774 A1 | | 7/2003 | Takasoh et al. |
| 2004/0114702 A1 | * | 6/2004 | Friedman et al. ........... 375/373 |

FOREIGN PATENT DOCUMENTS

JP    2002-359555    12/2002

OTHER PUBLICATIONS

J. Savoj et al., "A 10Gb/s CMOS Clock and Data Recovery Circuit with Frequency Detection", *ISSC Digest of Technical Papers*, Feb. 2001. pp. 78-79, 5(3), Los Angeles, CA.

* cited by examiner

*Primary Examiner*—David C. Payne
*Assistant Examiner*—Erin M. File
(74) *Attorney, Agent, or Firm*—Leydig, Voit & Mayer, Ltd.

(57) ABSTRACT

A half-rate clock and data recovery (CDR) circuit includes a half-rate phase detector for detecting phases of an input signal and a half-rate clock, a charge pump circuit, a low-pass filter and a voltage controlled oscillator for feeding the half-rate clock back to the half-rate phase detector. The half-rate phase detector includes a one-pulse delay circuit for generating a delay of one pulse. The phase comparison polarity of the half-rate phase detector including the one-pulse delay circuit enables use of an N type LC voltage controlled oscillator as the voltage controlled oscillator.

7 Claims, 12 Drawing Sheets

HALF-RATE CLOCK AND DATA RECOVERY CIRCUIT

BACKGROUND OF THE INVENTION

1. Field of the Invention

The present invention generally relates to a half-rate clock and data recovery (CDR) circuit operating at a half rate of 5 GHz equal to a half of a full rate of 10 GHz and more particularly, to improvement of margin of high-speed operation of the half-rate CDR circuit.

2. Description of the Prior Art

Conventionally, in response to trends to higher speed of optical communication network, CDR circuits have been manufactured by a high-speed process of semiconductors, etc. so as to operate at a data transfer rate of not less than 10 Gbits/sec. (Gbps). However, in view of recent trends to lower power consumption, the CDR circuits are manufactured by a CMOS process. Generally, in the CMOS process, the CDR circuits are manufactured so as to operate at opposite clock edges such that a ratio of a cutoff frequency Ft to a maximum oscillation frequency Fmax in a transistor, i.e., (Ft/Fmax) is compensated for, so that the CDR circuits do not need to operate at high speed and thus, may operate at the half rate of 5 GHz.

As described in, for example, a paper entitled "A 10 Gb/s CMOS Clock and Data Recovery Circuit with Frequency Detection", ISSC Digest of Technical Papers, pp.78-79, February 2001 by J. Savoj and B. Razavi, a conventional half-rate CDR circuit includes a half-rate phase and frequency detector for outputting a full-rate retimed signal, a charge pump circuit, a low-pass filter (LPF) and a voltage controlled oscillator (VCO) for outputting a half-rate clock.

In another known CDR circuit described in Japanese Patent Laid-Open Publication No. 2002-359555, when phase of a clock generated by a VCO lags behind that of input data, a phase detector outputs a pump-up signal so as to raise frequency of the output clock of the VCO. On the other hand, when phase of the clock generated by the VCO goes ahead of that of the input data, the phase detector outputs a pump-down signal so as to lower frequency of the output clock of the VCO.

In the prior art half-rate CDR circuits, since a half-rate phase detector does not have phase comparison polarity suitable for use in an N type VCO of low jitter, a P type VCO having poor jitter characteristics should be employed in many cases. Thus, in the prior art half-rate CDR circuits, such a problem arises that operating margin is insufficient due to increase of jitter of the feedback clock oscillated by the VCO.

Meanwhile, in case the N type VCO of low jitter is used in the prior art half-rate CDR circuits, such disadvantages are incurred that circuit configuration of the half-rate phase detector becomes complicated and circuit scale of the half-rate phase detector, namely, power consumption also becomes large.

Furthermore, the prior art half-rate CDR circuits have such an inconvenience that its delay amount cannot be adjusted from, outside.

SUMMARY OF THE INVENTION

Accordingly, an essential object of the present invention is to provide, with a view to eliminating the above mentioned drawbacks of prior art, a half-rate CDR circuit in which since not only due to usableness of an N type LC (inductance and capacitance) VCO of low jitter upon inversion of phase comparison polarity by inserting a one-pulse delay circuit in a conventional half-rate phase detector, margin of high-speed operation can be increased upon reduction of jitter of a feedback clock oscillated by the VCO but the feedback clock can be adjusted to an optimum phase by performing fine adjustments of high-speed operation from outside, a circuit configuration as a whole is stabilized and stability of high-speed operation is heightened.

In order to accomplish this object of the present invention, a half-rate CDR circuit according to the present invention includes a half-rate phase detector for detecting phases of an input signal and a half-rate clock, a charge pump circuit, a low-pass filter and a voltage controlled oscillator for feeding the half-rate clock back to the half-rate phase detector. The half-rate phase detector includes first-stage and second-stage latch circuits and further first-stage and second-stage latch circuits. A selector circuit receives an output of the first-stage latch circuit and an output of the further first-stage latch circuit so as to output a retimed signal. A first exclusive OR circuit receives an output of the second-stage latch circuit and an output of the further second-stage latch circuit so as to output so as to output a reference signal. A latch delay circuit is provided on a through-data path. A one-pulse delay circuit is provided on the through-data path so as to receive an output of the latch delay circuit and outputs through-data for generating a delay amount of one pulse. A second exclusive OR circuit receives the retimed signal from the selector circuit and the through-data from the one-pulse delay circuit so as to output an output signal. Phase comparison polarity of the half-rate phase detector provided with the one-pulse delay circuit enables use of an N type LC voltage controlled oscillator as the voltage controlled oscillator.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

First Embodiment

Figure 1:
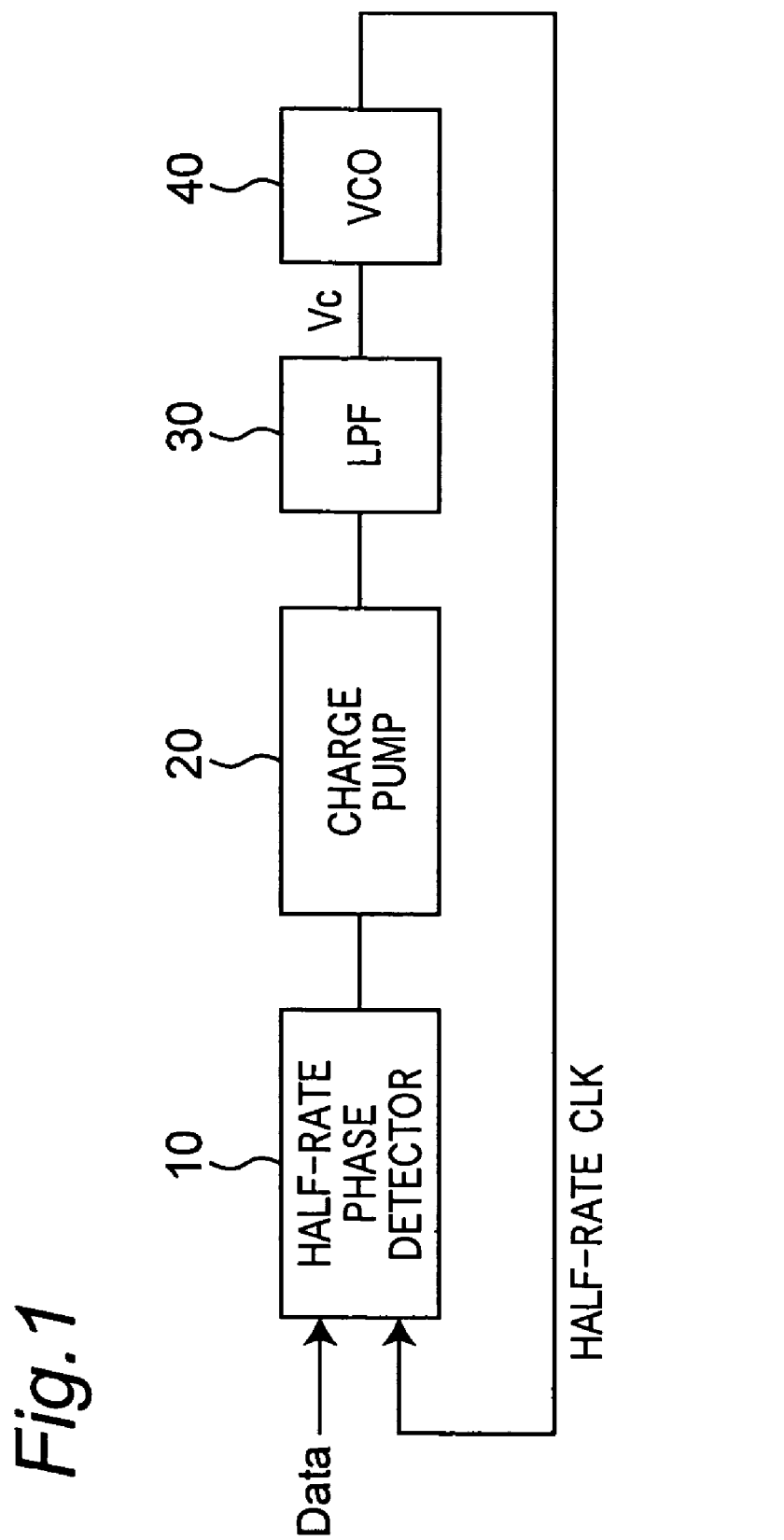
FIG. 1 is a block diagram showing a configuration of a half-rate clock and data recovery (CDR) circuit according to a first embodiment of the present invention.

FIG. 1 shows a whole configuration of a half-rate clock and data recovery (CDR) circuit according to a first embodiment of the present invention. This half-rate CDR circuit includes a half-rate phase detector 10, a charge pump circuit 20, a low-pass filter (LPF) 30 and a voltage controlled oscillator (VCO) 40, which are connected to one another in series. The half-rate CDR circuit is adapted to cause a phase of high-speed data received from outside and a phase of a feedback clock CLK oscillated from the VCO 40 to coincide with each other at all times.

Figure 2:
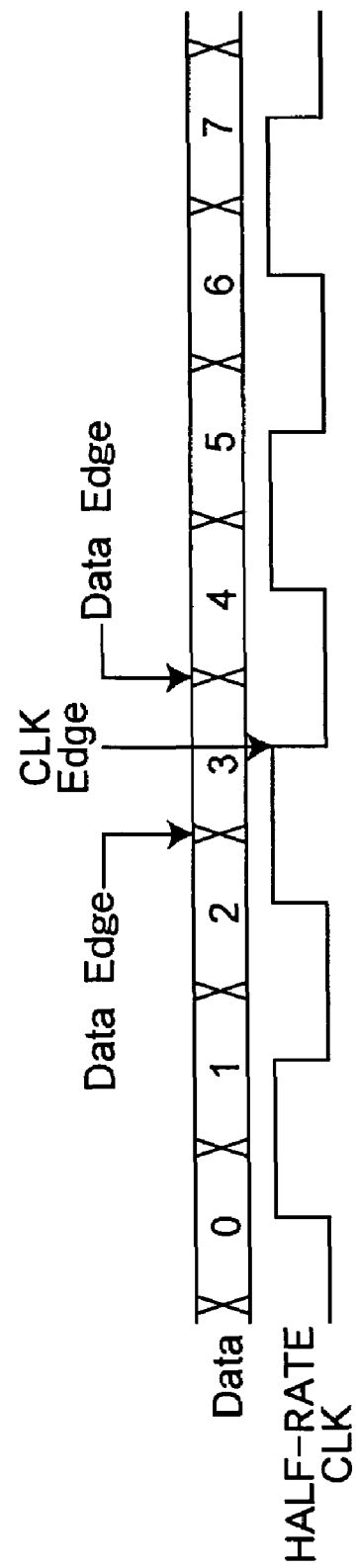
FIG. 2 is a timing chart of high-speed data and half-rate clock at the time of their synchronization in the half-rate CDR circuit of FIG. 1.

The half-rate phase detector 10 detects the phase of the high-speed data and the phase of the feedback clock CLK oscillated from the VCO 40 and outputs to the charge pump circuit 20 a voltage signal corresponding to a phase difference between the high-speed data and the feedback clock CLK. Since the half-rate phase detector 10 operates at opposite edges of the feedback clock CLK, the feedback clock CLK has a period equal to a half period of the high-speed data. Thus, the feedback clock CLK is a half-rate clock. When the phase of the high-speed data and the phase of the half-rate clock CLK are coincident with each other, each edge of the half-rate clock CLK is located at a center of each of data segments "0", "1", "2",—of the high-speed data as shown in FIG. 2.

The voltage signal outputted from the half-rate phase detector 10 is converted into a current signal by the charge pump circuit 20. Then, the low-pass filter 30 passes only a low-frequency component of the current signal from the charge pump circuit 20 therethrough so as to produce a control voltage Vc. Furthermore, the VCO 40 performs oscillation corresponding to the control signal Vc so as to output the half-rate clock CLK to the half-rate phase detector 10.

Figure 3:
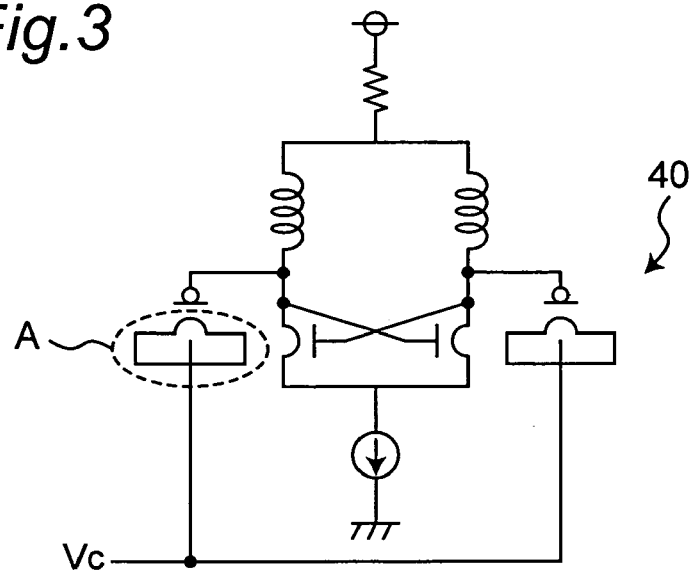
FIG. 3 a circuit diagram of a voltage controlled oscillator (VCO) employed in the half-rate CDR circuit of FIG. 1.
Figure 4:
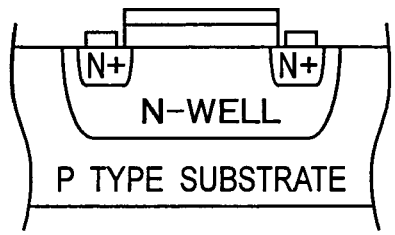
FIG. 4 is a schematic view of showing a configuration of a varactor of the VCO of FIG. 3.
Figure 5A:
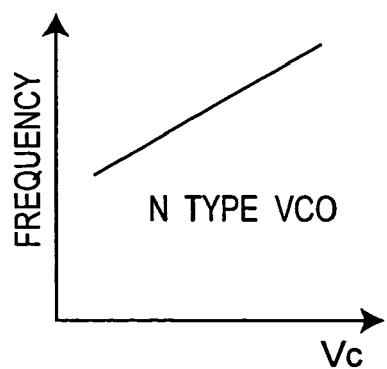
FIGS. 5A and 5B are graphs showing N type VCO characteristics and P type VCO characteristics, respectively.
Figure 5B:
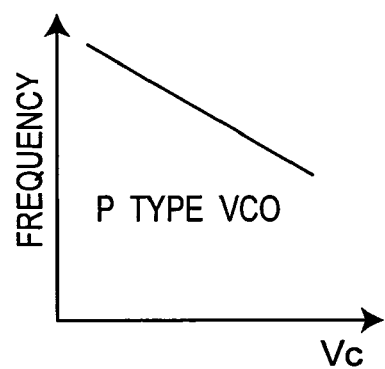

FIG. 3 shows the VCO 40 and FIG. 4 shows a configuration of a varactor enclosed by a broken line A in the VCO 40 of FIG. 3. As shown in FIG. 3, the VCO 40 performs LC (inductance and capacitance) oscillation. Meanwhile, as is apparent from FIG. 4, the varactor is an N type varactor employing a P type substrate. Therefore, the VCO 40 is of N type LC. As shown in FIG. 5A, the N type VCO 40 exhibits characteristics in which frequency increases gradually proportionally relative to the control voltage Vc. On the other hand, as shown in FIG. 5B giving a comparative example, a conventional P type VCO exhibits characteristics in which frequency decreases gradually proportionally relative to the control voltage Vc.

Figure 6:
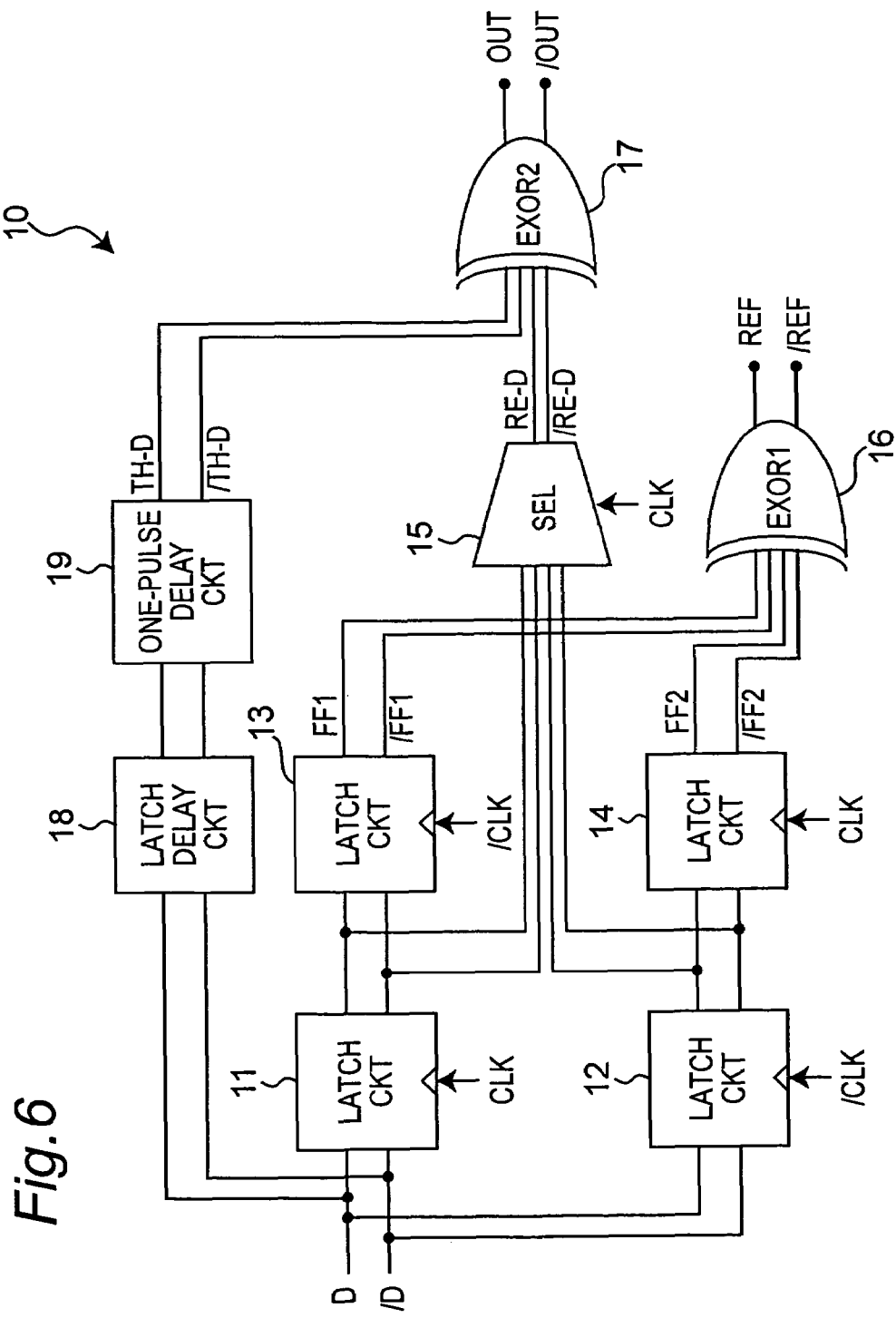
FIG. 6 is a circuit diagram of a half-rate phase detector employed in the half-rate CDR circuit of FIG. 1.
Figure 7:
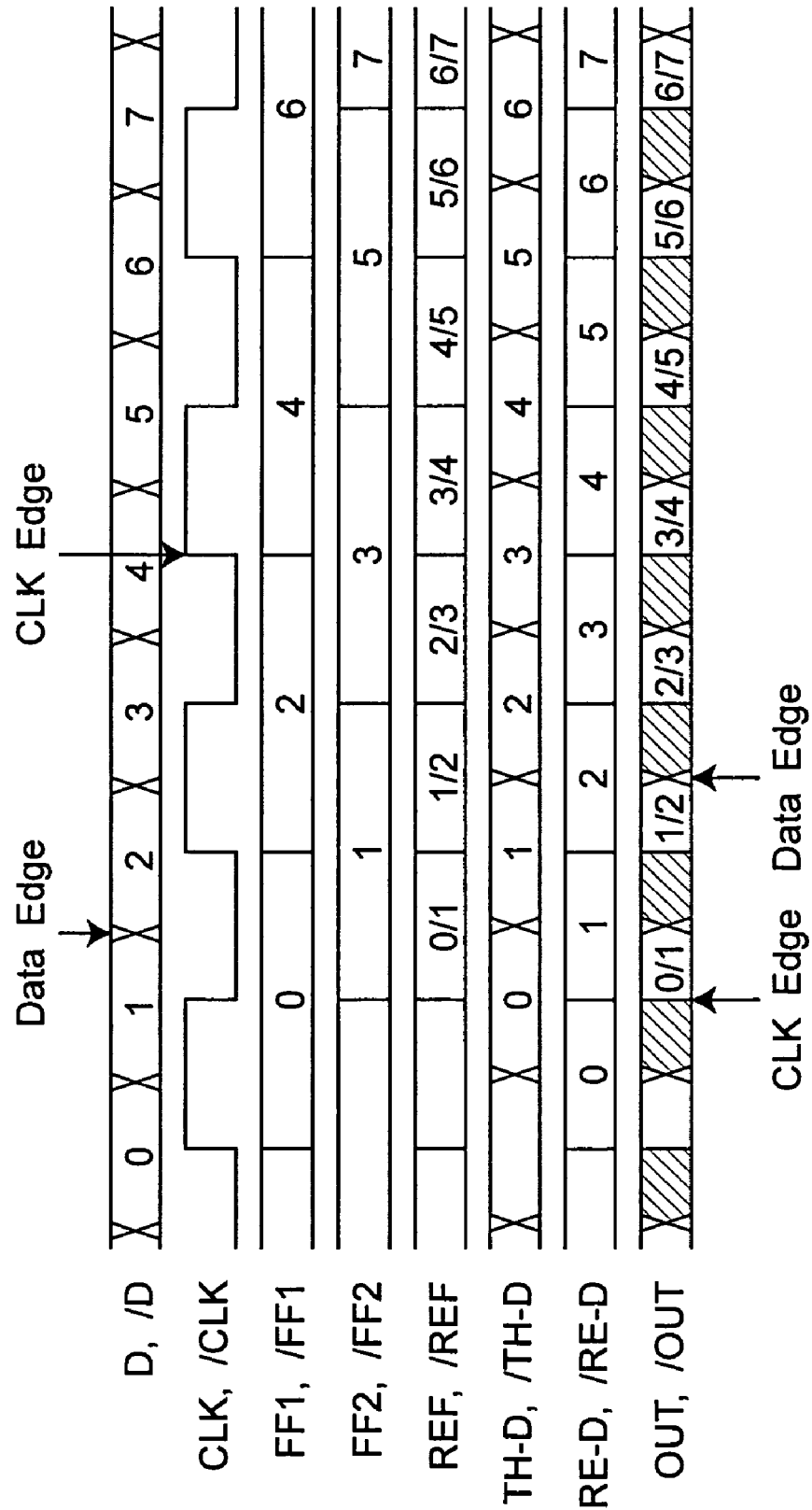
FIG. 7 is a timing chart of signals of the half-rate phase detector of FIG. 6.

FIG. 6 shows a configuration of the half-rate phase detector 10 which is obtained by adding a one-pulse delay circuit 19 to a conventional half-rate phase detector. FIG. 7 is a timing chart of signals of the half-rate phase detector 10. The half-rate phase detector 10 includes a first-stage latch circuit 11 which receives differential high-speed data D and /D from outside and the half-rate clock CLK, a further first-stage latch circuit 12 which receives the differential high-speed data D and /D and an inverted half-rate clock /CLK, a second-stage latch circuit 13 which receives an output of the first-stage latch circuit 11 and the inverted half-rate clock /CLK so as to output a signal FF1 and its inverted signal /FF1 and a further second-stage latch circuit 14 which receives an output of the further first-stage latch circuit 12 and the half-rate clock CLK so as to output a signal FF2 and its inverted signal /FF2.

The half-rate phase detector 10 also includes a selector circuit 15 which receives the outputs of the first-stage latch circuits 11 and 12 and the half-rate clock CLK so as to output a retimed signal RE-D and its inverted retimed signal /RE-D and a first exclusive OR circuit 16 which receives the signal FF1 and the inverted signal /FF1 outputted from the second-stage latch circuit 13 and the signal FF2 and the inverted signal /FF2 outputted from the further second-stage latch circuit 14 so as to output a reference signal REF and its inverted reference signal /REF.

The half-rate phase detector 10 further includes a latch delay circuit 18 which is provided on a through-data path, a one-pulse delay circuit 19 which is provided on the through-data path so as to receive an output of the latch delay circuit 18 and outputs through-data TH-D and its inverted through-data /TH-D and a second exclusive OR circuit 17 which receives the retimed signal RE-D and the inverted retimed signal /RE-D outputted from the selector circuit 15 and the through-data TH-D and the inverted through-data /TH-D outputted from the one-pulse delay circuit 19 so as to output an output signal OUT and its inverted output signal /OUT.

Operation of the half-rate phase detector 10 of the above described configuration is described below. Initially, the differential high-speed data D and /D from outside and the half-rate clock CLK are inputted to the first-stage latch circuit 11, while the differential high-speed data D and /D and the inverted half-rate clock /CLK are inputted to the further first-stage latch circuit 12. The differential high-speed data D and /D are also inputted to the latch delay circuit 18. The differential high-speed data D and /D not only are latched by the first-stage latch circuit 11 and the second-stage latch circuit 13 so as to be outputted as the signal FF1 and the inverted signal /FF1 but are latched by the further first-stage latch circuit 12 and the further second-stage latch circuit 14 so as to be outputted as the signal FF2 and the inverted signal /FF2.

The signal FF1 and the inverted signal /FF1 and the signal FF2 and the inverted signal /FF2 are retimed by the differential half-rate clocks CLK and /CLK and thus, are synchronous with edges of the differential half-rate clocks CLK and /CLK as shown in FIG. 7. Then, the first exclusive OR circuit 16 performs exclusive OR operation of the signal FF1, the inverted signal /FF1, the signal FF2 and the inverted signal /FF2 and outputs the reference signal REF and the inverted reference signal REF shown in FIG. 7. Pulses of the reference signal REF and the inverted reference signal /REF rise only at the time of change of the differential high-speed data D and /D. Meanwhile, edges of the reference signal REF and the inverted reference signal /REF are synchronous with edges of the differential half-rate clocks CLK and /CLK.

Furthermore, the selector circuit 15 receives outputs of the first-stage latch circuit 11 and the further first-stage latch circuit 12 and outputs the retimed signal RE-D and the inverted retimed signal /RE-D. Thus, as shown in FIG. 7, the retimed signal RE-D and the inverted retimed signal /RE-D have an array identical with that of the differential high-speed data D and /D but change at points synchronous with the edges of the differential half-rate clocks CLK and /CLK.

Figure 8:
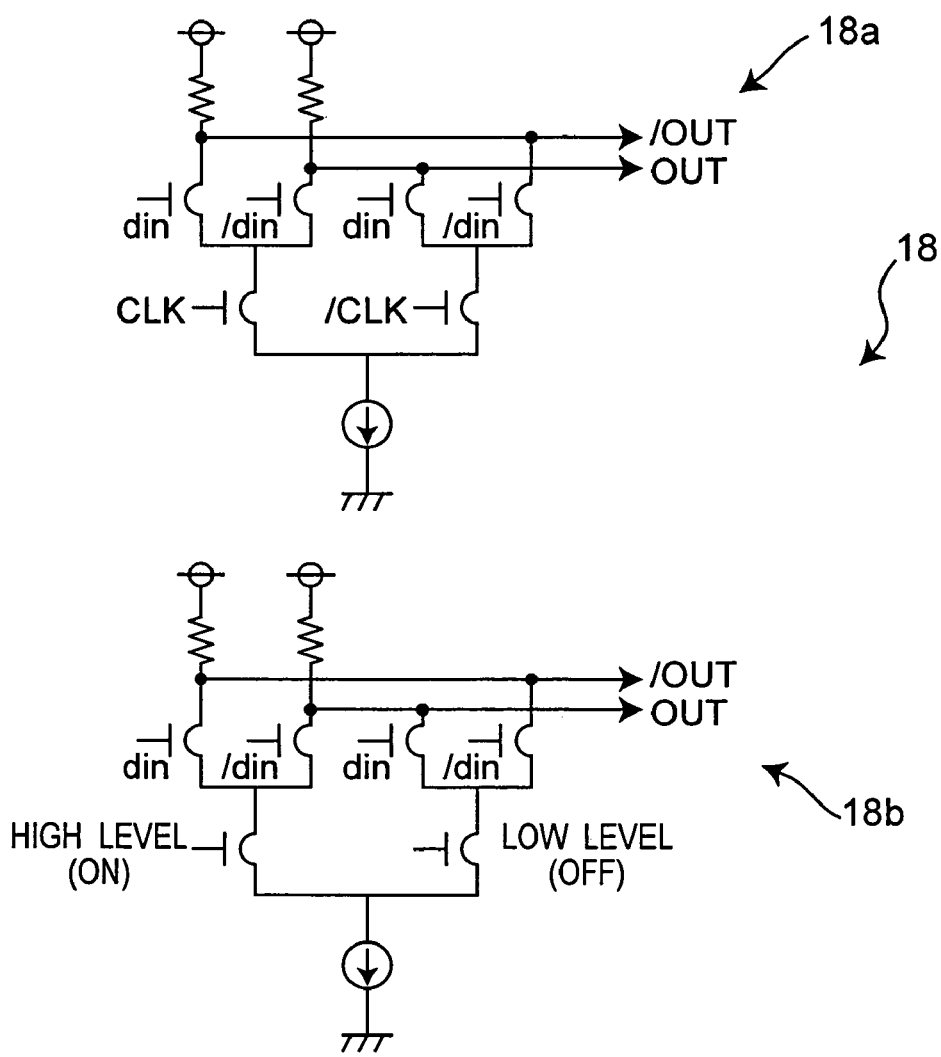
FIG. 8 is a circuit diagram of a latch delay circuit employed in the half-rate phase detector of FIG. 6.
Figure 9:
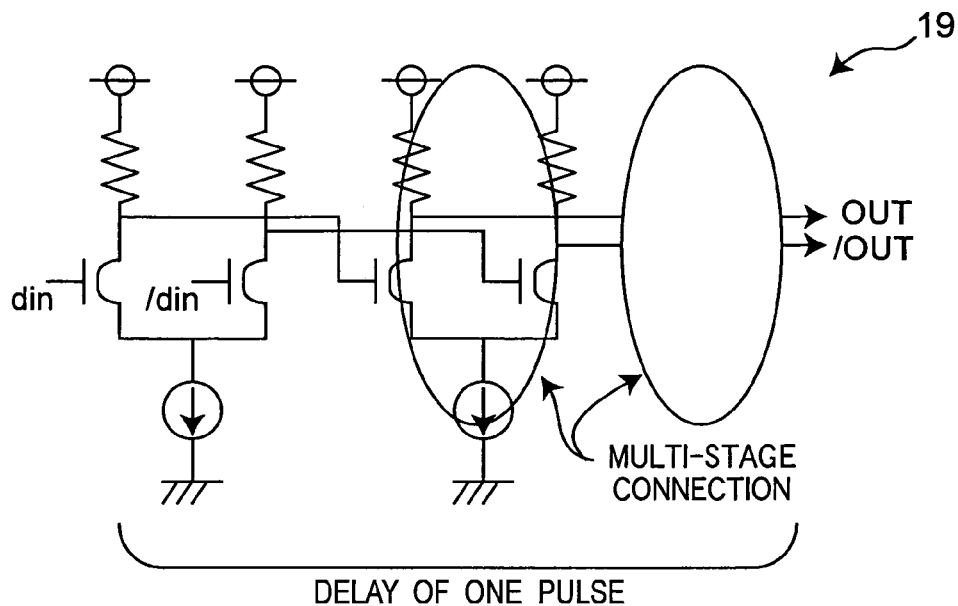
FIG. 9 is a circuit diagram of a one-pulse delay circuit employed in the half-rate phase detector of FIG. 6.

On the other hand, the latch delay circuit 18 is a circuit for adding a delay amount identical with that of the second-stage latch circuit 13 and the further second-stage latch circuit 14. As shown in FIG. 8, the latch delay circuit 18 includes a latch circuit 18a and a latch replica circuit 18b which have only an identical load without performing latching operation and have a delay amount identical with that of the second-stage latch circuit 13 and the-further second-stage latch circuit 14. Meanwhile, the one-pulse delay circuit 19 is provided for adding a delay amount equal to one period of the half-rate clock CLK, namely, a delay amount of one pulse. For example, as shown in FIG. 9, the one-pulse delay circuit 19 is obtained by connecting buffers in a plurality of stages. The differential high-speed data D and /D pass through the latch delay circuit 18 and the one-pulse delay circuit 19 and are outputted as the through-data TH-D and the inverted through-data /TH-D at timing illustrated in FIG. 7.

If the differential high-speed data D and /D are latched upon deviation of their phase through a half period of the differential half-rate clocks CLK and /CLK, namely, the differential high-speed data D and /D are synchronous with the differential half-rate clocks CLK and /CLK the through-data TH-D and the inverted through-data /TH-D are outputted at a timing in which their phase deviate through a half period of the retimed signal RE-D and the inverted retimed signal /RE-D. Meanwhile, phase of the through-data TH-D and the inverted through-data /TH-D reflects that of the differential high-speed data D and /D.

Subsequently, by performing exclusive OR operation of the through-data TH-D, the inverted through-data /TH-D, the retimed signal RE-D and the inverted retimed signal /RE-D, the second exclusive OR circuit 17 outputs the output signal OUT and the inverted output signal /OUT. In FIG. 7, pulses of the output signal OUT and the inverted output signal /OUT do not rise at hatching portions and reflect phases of the differential high-speed data D and /D and the differential half-rate clocks CLK and /CLK It is supposed here that, for example, phase of the differential high-speed data D and /D is fixed and phase the of the differential half-rate clocks CLK and-/CLK changes. When the phase of the-differential half-rate clocks CLK and /CLK is shifted forwardly of that of the differential high-speed data D and /D, high-level duration of pulses of the output signal OUT and the inverted output signal /OUT increases. On the contrary, when the phase of the differential half-rate clocks CLK and /CLK is shifted rearwardly of that of the differential high-speed data D and /D, the high-level duration of the pulses of the output signal OUT and the inverted output signal /OUT decreases. Namely, the phases of the differential high-speed data D and /D and the differential half-rate clocks CLK and /CLK can be detected from the output signal OUT and the inverted output signal /OUT.

In case the differential high-speed data D and /D and the differential half-rate clocks CLK and /CLK are in-phase with each other, namely, each edge of the differential half-rate clocks CLK and /CLK is located at a center of each data segment of the differential high-speed data D and /D, pulses of a half period of the differential high-speed data D and /D rise only when the differential high-speed data D and /D have been changed by the output signal OUT and the inverted output signal /OUT. On the other hand, since the reference signal REF and the inverted reference signal /REF do not make reference to edges of the differential high-speed data D and /D, pulses in-phase with the differential half-rate clocks CLK and /CLK at all times rise in the reference signal REF and the inverted reference signal /REF.

Figure 10:
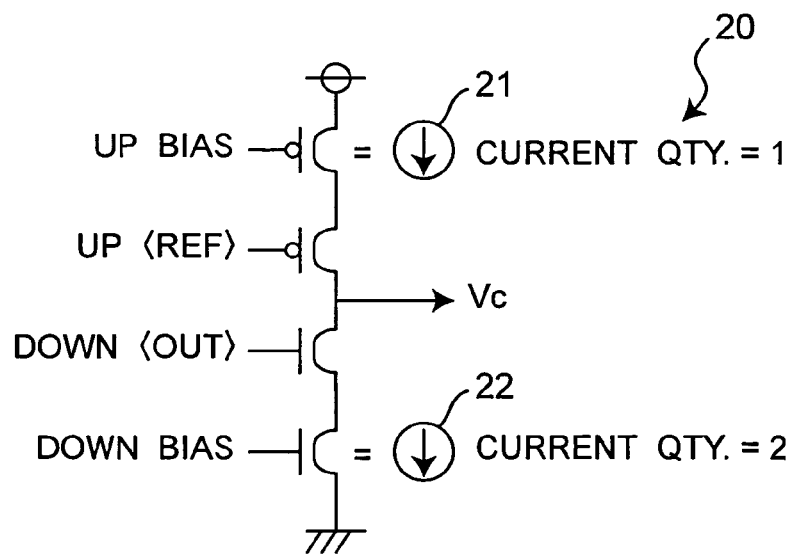
FIG. 10 is a circuit diagram of a charge pump circuit employed in the half-rate CDR circuit of FIG. 1.

As shown in FIG. 10, the reference signal REF and the inverted reference signal /REF from the first exclusive OR circuit 16 are inputted, as a pump-up signal UP, to the charge pump circuit 20, while the output signal OUT and the inverted output signal /OUT from the second exclusive OR circuit 17 are inputted, as a pump-down signal DOWN, to the charge pump circuit 20. When the differential high-speed data D and /D are synchronous with the differential half-rate clocks CLK and /CLK, the reference signal REF and the inverted reference signal /REF have a pulse width twice that of the output signal OUT and the inverted output signal /OUT.

Thus, by providing a pump-up constant current source 21 and a pump-down constant current source 22 such that a ratio of a constant current quantity of the pump-up constant current source 21 to that of the pump-down constant current source 22 is set at ½ as shown in FIG. 10, a total quantity of electric charge flowing into the control voltage Vc from the pump-up constant current source 21 and the pump-down constant current source 22 of the charge pump circuit 20 via the low-pass filter 30 is made constant. When phase of the differential half-rate clocks CLK and /CLK has shifted forwardly of that of the differential high-speed data D and /D, quantity of electric charge flowing into the control voltage Vc from the pump-down constant current source 22 increases, so that the control voltage Vc drops. If the control voltage Vc drops, oscillation of the VCO 40 is delayed and thus, the differential half-rate clocks CLK and /CLK are recovered rearwardly.

On the contrary, when phase of the differential half-rate clocks CLK and /CLK has shifted rearwardly of that of the differential high-speed data D and /D, quantity of electric charge flowing into the control voltage Vc from the pump-up constant current source 21 increases, so that the control voltage Vc rises: If the control voltage Vc rises, oscillation of the VCO 40 is advanced and thus, the differential half-rate clocks CLK and /CLK are recovered forwardly As a result, the differential half-rate clocks CLK and /CLK are operated so as to be in-phase with the differential high-speed data D and /D at all times.

In this embodiment, since the low-jitter VCO 40 of N type LC can be used through inversion of phase comparison polarity by inserting the one-pulse delay circuit 19 in the half-rate phase detector 10, jitter of the half-rate clock CLK oscillated from the VCO 40 decreases, so that reception sensitivity of the high-speed data is raised and margin of high-speed operation is enlarged. As a result, the half-rate CDR circuit is stabilized as a whole and stability of high-speed operation of the half-rate CDR circuit is enhanced.

Second Embodiment

Figure 11:
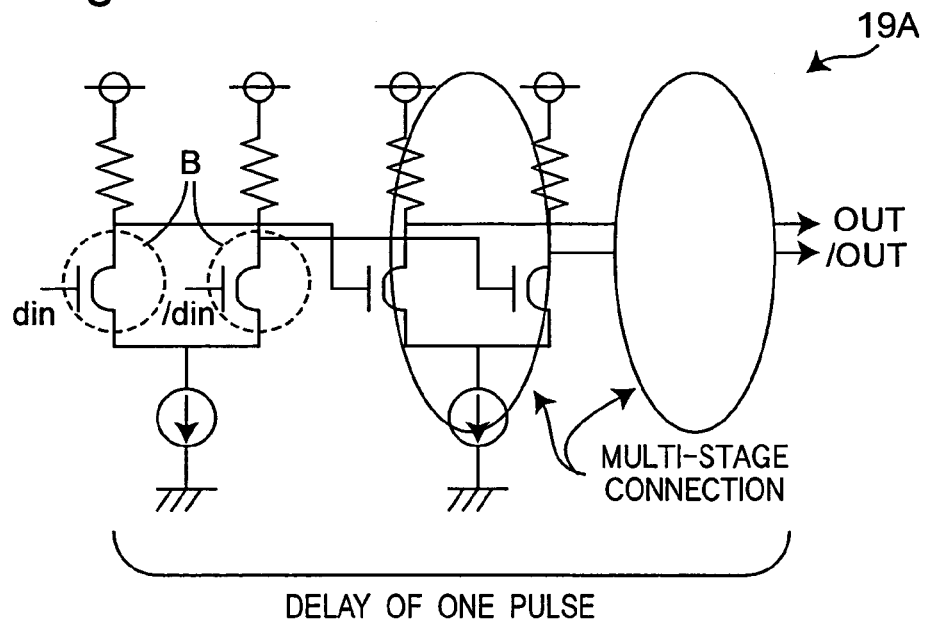
FIG. 11 is a circuit diagram of a one-pulse delay circuit employed in a half-rate phase detector of a half-rate CDR circuit according to a second embodiment of the present invention.

FIG. 11 shows a detailed configuration of a one-pulse delay circuit 19A employed in a half-rate phase detector 10 of a half-rate CDR circuit according to a second embodiment of the present invention. In the first embodiment, the one-pulse delay circuit 19 receives the high-speed data and thus, generates a delay amount of one pulse by connecting in a plurality of stages current mode logic (CML) buffers capable of operating at high speed as shown in FIG. 9. However, in the one-pulse delay circuit 19, adjustment of the delay amount through changeover of the number of the stages of the buffers becomes as large as 20 ps.

Thus, in the one-pulse delay circuit 19A of this embodiment, fine adjustment of the delay amount of one pulse can be performed by making size of switching gates (portions B) of the buffers variable. If the size of the switching gates is increased, switching speed drops and thus, the delay amount of one pulse increases. On the contrary, if the size of the switching gates is reduced, switching speed rises and thus, the delay amount of one pulse decreases.

In this embodiment, since not only switching speed can be mitigated but fine adjustment of the delay amount of one pulse can be performed by changing the size of the switching gates of the one-pulse delay circuit 19A of the half-rate phase detector 10, the half-rate clock CLK can be stabilized to an optimum phase, so that the half-rate CDR circuit is stabilized as a whole and stability of high-speed operation of the half-rate CDR circuit is enhanced.

Third Embodiment

Figure 12:
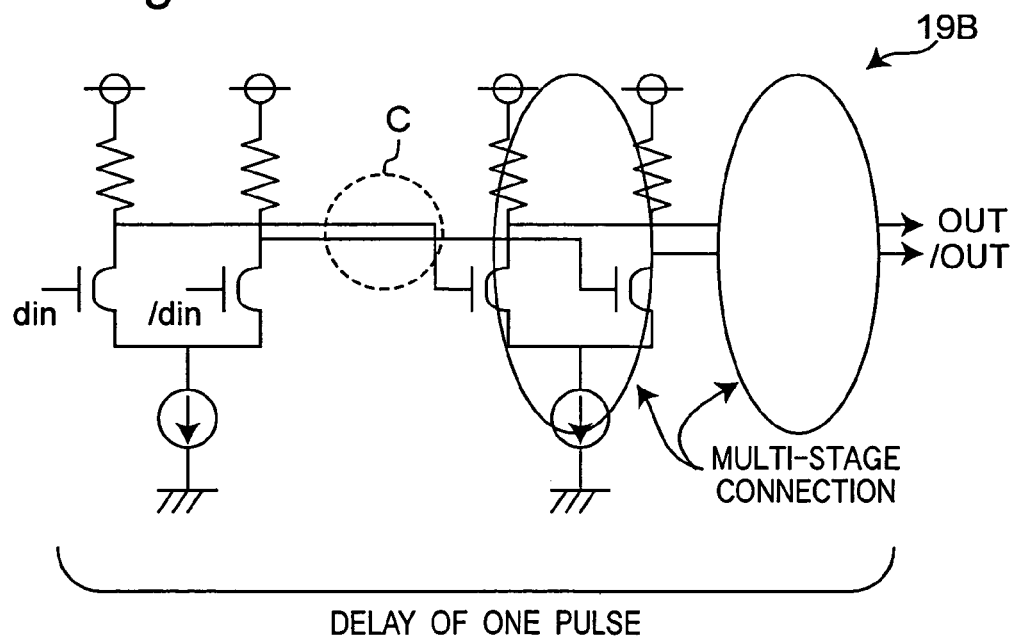
FIG. 12 is a circuit diagram of a one-pulse delay circuit employed in a half-rate phase detector of a half-rate CDR circuit according to a third embodiment of the present invention.

FIG. 12 shows a detailed configuration of a one-pulse delay circuit 19B employed in a half-rate phase detector 10 of a half-rate CDR circuit according to a third embodiment of the present invention. In the one-pulse delay circuit 19B, fine adjustment of the delay amount of one pulse can be performed by making wiring length (portion C) between neighboring ones of the buffers variable. If the wiring length is increased, the wiring delay amount increases and thus, the delay amount of one pulse increases. On the contrary, if the wiring length is reduced, the wiring delay amount decreases and thus, the delay amount of one pulse decreases.

In this embodiment, since fine adjustment of the delay amount of one pulse can be performed by making the wiring length between neighboring ones of the buffers variable, the half-rate clock CLK can be stabilized to an optimum phase, so that the half-rate CDR circuit is stabilized as a whole and stability of high-speed operation of the half-rate CDR circuit is enhanced.

Fourth Embodiment

Figure 13:
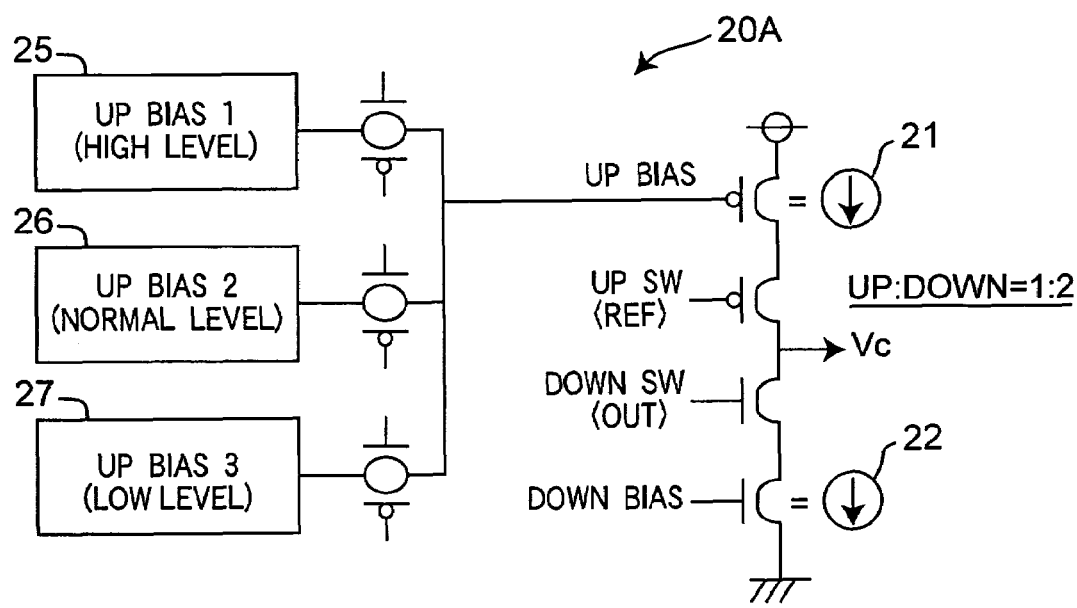
FIG. 13 is a circuit diagram of a charge pump circuit employed in a half-rate CDR circuit according to a fourth embodiment of the present invention.

FIG. 13 shows a charge pump circuit 20A employed in a half-rate CDR circuit according to a fourth embodiment of the present invention. By changing quantity of pump-up current of the charge pump circuit 20A so as to compensate for the one-pulse delay circuit 19 of the half-rate phase detector 10, fine adjustment of the delay amount of one pulse is performed.

If the through-data TH-D and the inverted through-data /TH-D can be outputted so as to have a delay amount of one pulse relative to the differential high-speed data D and /D as shown in FIG. 7, each-edge of the differential half-rate clocks CLK and /CLK is located at a center of each data segment of the differential high-speed data D and /D by setting a ratio of the pump-up signal UP to the pump-down signal DOWN to ½.

Figure 14:
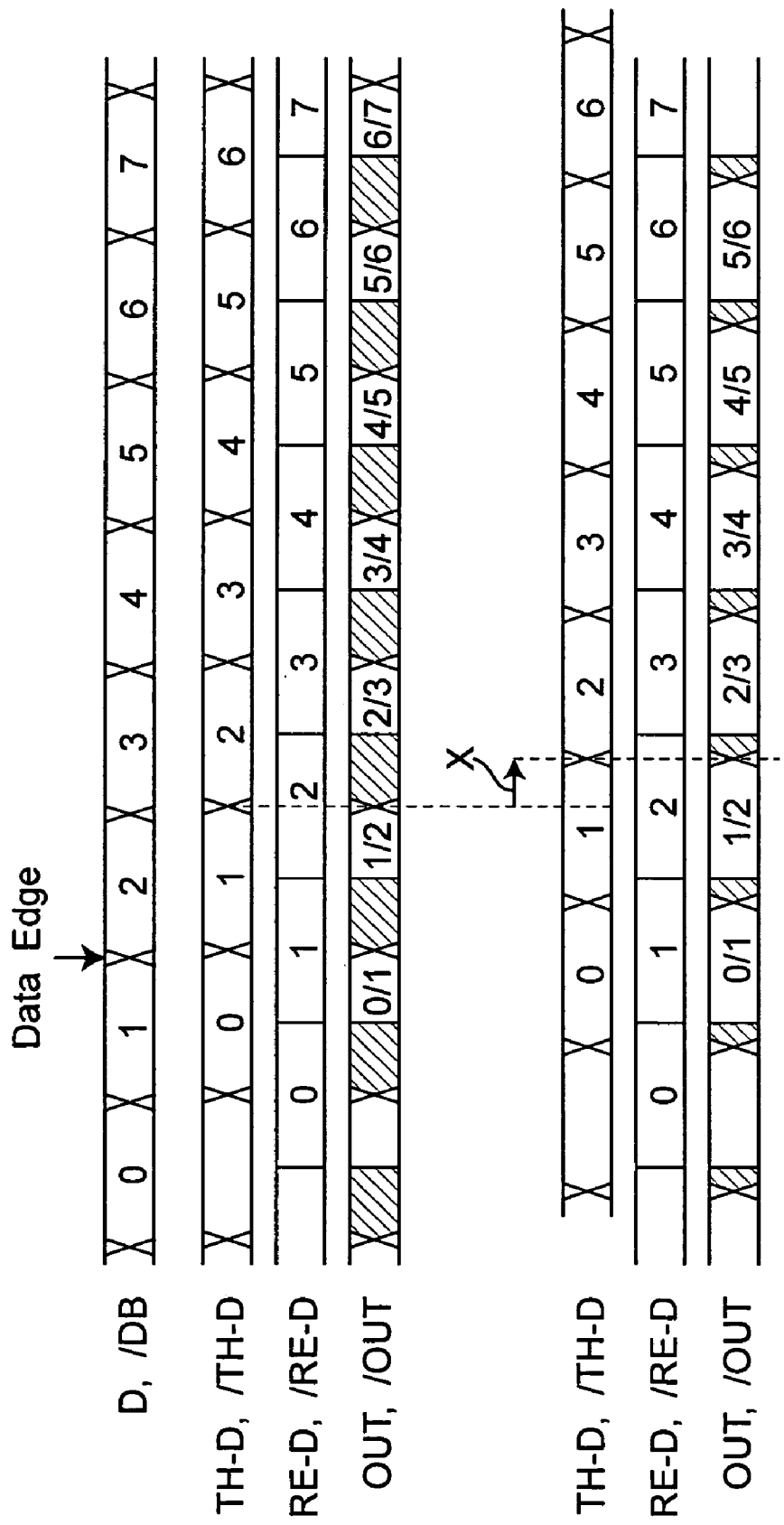
FIG. 14 is a timing chart of signals at the time of an error of a delay amount of one pulse in a half-rate phase detector employed in the half-rate CDR circuit of FIG. 13.

However, when the one-pulse delay circuit 19 is not capable of generating the delay amount of one pulse accurately, each edge of the differential half-rate clocks CLK and /CLK is not located at a center of each data segment of the differential high-speed data D and /D stably so as to be shifted to either one of opposite edges of the differential high-speed data D and /D as shown by the arrow X in FIG. 14. This narrows reception sensitivity of the high-speed data, thereby resulting in reduction of margin of high-speed operation.

By adjusting constant current quantity of the charge pump circuit 20A in order to compensate for the above phenomenon, each edge of the differential half-rate clocks CLK and /CLK is located at the center of each data segment of the differential high-speed data D and /D stably. To this end, by changing current quantity of the pump-up constant current source 21, fine adjustment of shift of the delay amount of one pulse is performed. Increase of current quantity of the pump-up constant current source 21 is tantamount to rise of operating speed of the one-pulse delay circuit 19.

In order to adjust current quantity of the pump-up constant current source 21, three pump-up bias circuits having gate biases of different levels, namely, a first pump-up bias circuit 25 having a high-level gate bias, a second pump-up bias circuit 26 having a normal-level gate bias and a third pump-up bias circuit 27 having a low-level gate bias are provided for the pump-up constant current source, 21 of the charge pump circuit 20A. By changing over the first, second and third pump-up bias. Circuits 25, 26 and 27 by a transmission gate from outside, it is also possible to deal with scatter of performance of semiconductor chips of the half-rate CDR circuit.

In this embodiment, since fine adjustment of the delay amount of one pulse can be performed by changing pump-up current quantity of the charge pump circuit 20A upon changeover of the three pump-up bias circuits 25 to 27 having the different gate bias levels, the half-rate clock CLK can be stabilized to an optimum phase, so that the half-rate CDR circuit is stabilized as a whole and stability of high-speed operation of the half-rate CDR circuit is enhanced.

Fifth Embodiment

Figure 15:
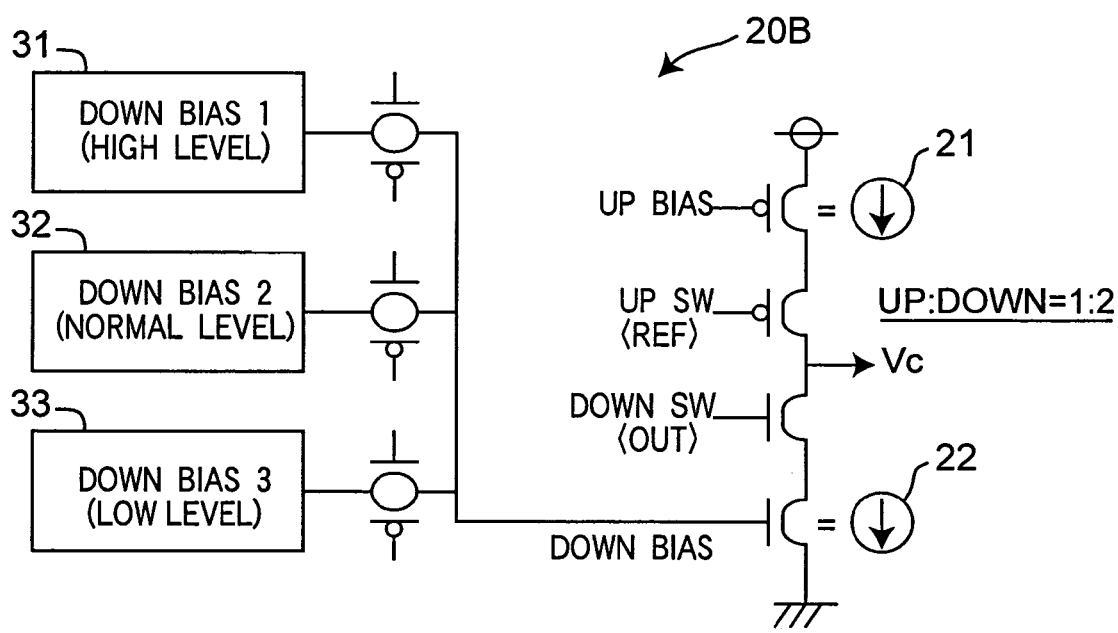
FIG. 15 is a circuit diagram of a charge pump circuit employed in a half-rate CDR circuit according to a fifth embodiment of the present invention.

FIG. 15 shows a charge pump circuit 20B employed in a half-rate CDR circuit according to a fifth embodiment of the present invention. In the same manner as the charge pump circuit 20A of the fourth embodiment, the charge pump circuit 20B compensates for the one-pulse delay circuit 19 of the half-rate phase detector 10. In the charge pump circuit 20A, current quantity of the pump-up constant current source 21 is changed. On the other hand, in this embodiment, by changing current quantity of the pump-down constant current source 22 in order to compensate for the one-pulse delay circuit 19, fine adjustment of the delay amount of one pulse is performed. Increase of current quantity of the pump-down constant current source 22 is tantamount to drop of operating speed of the one-pulse delay circuit 19.

In order to adjust current quantity of the pump-down constant current source 22, three pump-down bias circuits having gate biases of different levels, namely, a first pump-down circuit 31 having a high-level gate bias, a second pump-down bias circuit 32 having a normal-level gate bias and a third pump-down bias circuit 33 having a low-level gate bias are provided for the pump-down constant current source 22 of the charge pump circuit 20B. By changing over the first, second and third pump-down bias circuits 31, 32 and 33 by a transmission gate from outside, it is also possible to deal with scatter of performance of semiconductor chips of the half-rate CDR circuit.

In this embodiment, since fine adjustment of the delay amount of one pulse can be performed by changing pump-down current quantity of the charge pump circuit 20B upon changeover of the three pump-down bias circuits 31 to 33 having the different gate bias levels, the half-rate clock CLK can be stabilized to an optimum phase, so that the half-rate CDR circuit is stabilized as a whole and stability of high-speed operation of the half-rate CDR circuit is enhanced.

Sixth Embodiment

Figure 16:
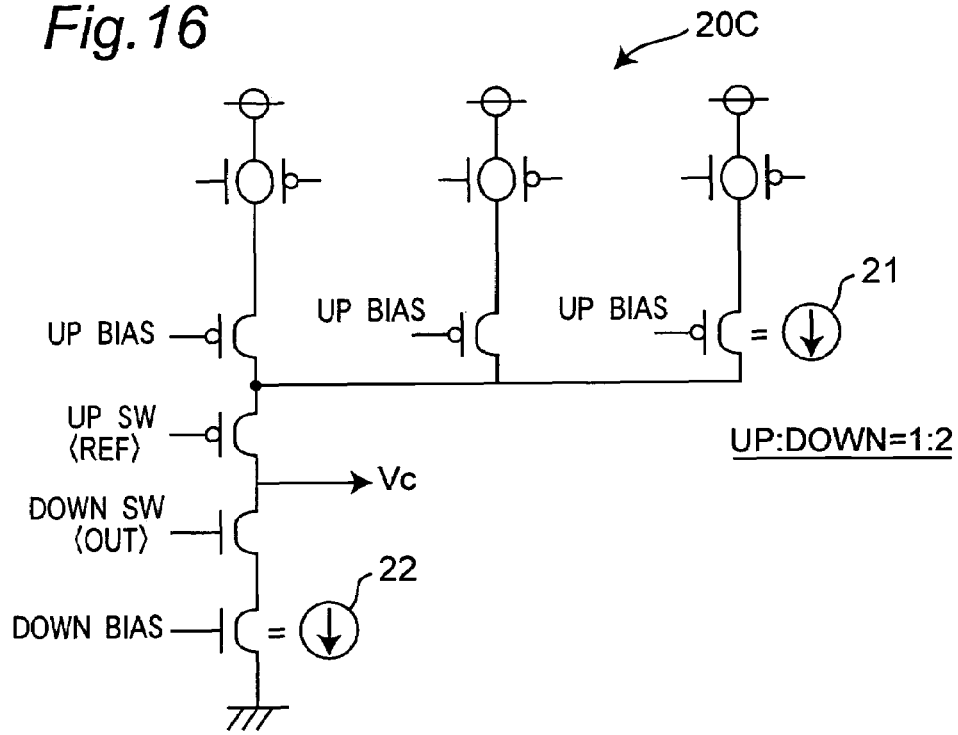
FIG. 16 is a circuit diagram of a charge pump circuit employed in a half-rate CDR circuit according to a sixth embodiment of the present invention.

FIG. 16 shows a charge pump circuit 20C employed in a half-rate CDR circuit according to a sixth embodiment of the present invention. In the same manner as the charge pump circuit 20A of the fourth embodiment, the charge pump circuit 20C performs fine adjustment of the delay amount of one pulse. In the charge pump circuit 20A, the three pump-up bias circuits 25 to 27 having the different gate bias levels are changed over so as to change current quantity of the pump-up constant current source 21 of the charge pump circuit 20A. On the other hand, in this embodiment, the number of the pump-up constant current sources 21 of the charge pump circuit 20C, namely, size of a transistor forming the pump-up constant current sources 21 is changed so as to change current quantity of the pump-up constant current sources 21.

Thus, in the charge pump circuit 20C, since a plurality of the pump-up bias circuits 25 to 27 of the fourth embodiment are not required to be provided, layout is made compact. Meanwhile, by changing over, by a transmission gate from outside, size of the transistor forming the pump-up constant current sources 21, it is also possible to deal with scatter of performance of semiconductor chips of the half-rate CDR circuit.

In this embodiment, since fine adjustment of the delay amount of one pulse can be performed by changing pump-up current quantity of the charge pump circuit 20C upon changeover of size of the transistor forming the pump-up constant current sources 21, the half-rate clock CLK can be stabilized to an optimum phase, so that the half-rate CDR circuit is stabilized as a whole and stability of high-speed operation of the half-rate CDR circuit is enhanced.

Seventh Embodiment

Figure 17:
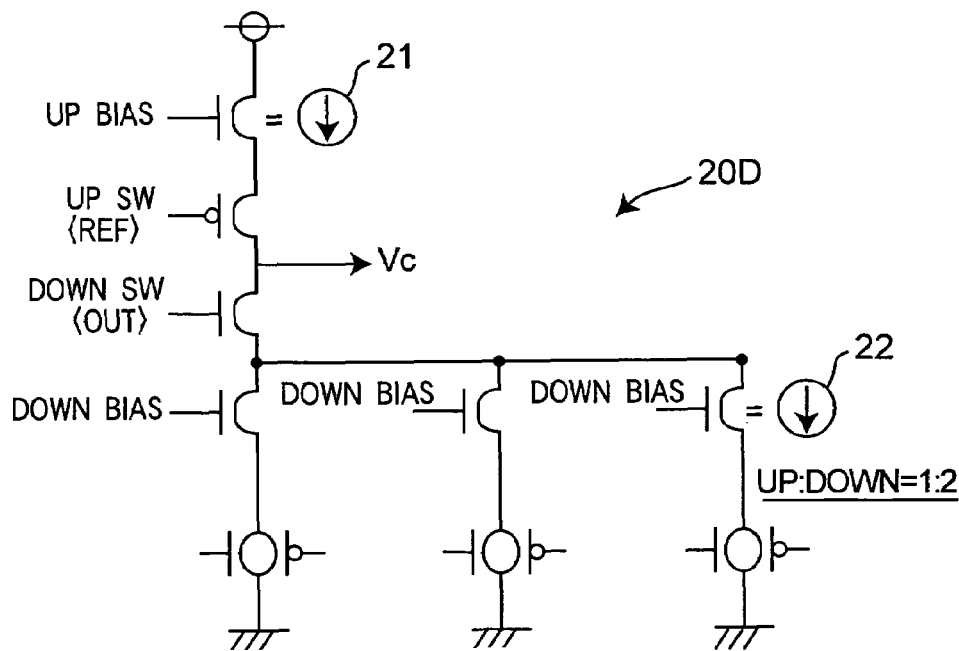
FIG. 17 is a circuit diagram of a charge pump circuit employed in a half-rate CDR circuit according to a seventh embodiment of the present invention.

FIG. 17 shows a charge pump circuit 20D employed in a half-rate CDR circuit according to a seventh embodiment of the present invention. In the same manner as the charge pump circuit 20B of the fifth embodiment, the charge pump circuit 20D performs fine adjustment of the delay amount of one pulse. In the charge pump circuit 20B, the three pump-down bias circuits 31 to 33 having the different gate bias levels are changed over so as to change current quantity of the pump-down constant current source 22 of the charge pump circuit 20B. On the other hand, in this embodiment, the number of the pump-down constant current sources 22 of the charge pump circuit 20D, namely, size of a transistor forming the pump-down constant current sources 22 is changed so as to change current quantity of the pump-down constant current sources 22.

Thus, in the charge pump circuit 20D, since a plurality of the pump-down bias circuits 31 to 33 of the fifth embodiment are not required to be provided, layout is made compact. Meanwhile, by changing over, by a transmission gate from outside, size of the transistor forming the pump-down constant current sources 22, it is also possible to deal with scatter of performance of semiconductor chips of the half-rate CDR circuit.

In this embodiment, since fine adjustment of the delay amount of one pulse can be performed by changing pump-down current quantity of the charge pump circuit 20D upon changeover of size of the transistor forming the pump-down constant current sources 22, the half-rate clock CLK can be stabilized to an optimum phase, so that the half-rate CDR circuit is stabilized as a whole and stability of high-speed operation of the half-rate CDR circuit is enhanced.

As is clear from the foregoing description of the half-rate CDR circuit of the present invention, since phase comparison polarity of the half-rate phase detector provided with the one-pulse delay circuit enables use of the N type LC voltage controlled oscillator as the voltage controlled oscillator, jitter of the half-rate clock oscillated from the voltage controlled oscillator is reduced, so that reception sensitivity of the input signal is raised and margin of high-speed operation of the half-rate CDR circuit is enlarged. As a result, the half-rate CDR circuit is stabilized as a whole and stability of high-speed operation of the half-rate CDR circuit is enhanced.

What is claimed is:

1. A half-rate clock and data recovery (CDR) circuit including;
    a half-rate phase detector for detecting phases of an input signal and a half rate clock and producing a comparison signal;
    a charge pump circuit receiving the comparison signal and, in response, producing a pump signal;
    a low-pass filter receiving and filtering the pump signal to produce a control signal; and
    a voltage controlled oscillator receiving the control signal and, in response, generating the half-rate clock and feeding the half-rate clock back to the half-rate phase detector, the half-rate phase detector comprising
        a first-stage latch circuit receiving the input signal and a second-stage latch circuit receiving an output of the first-stage latch circuit,
        an additional first-stage latch circuit receiving the input signal and an additional second-stage latch circuit receiving an output of the additional first-stage latch circuit,
        a selector circuit which receives an output of the first-stage latch circuit and an output of the additional first-stage latch circuit and outputs, in response, a re-timed signal synchronous with the half-rate clock and identical in array to the input signal,
        a first exclusive OR circuit which receives an output of the second-stage latch circuit and an output of the additional second-stage latch circuit and outputs a reference signal in response;
        a latch delay circuit in a though-data path and receiving the input signal,
        a one-pulse delay circuit in the through-data path, receiving an output of the latch delay circuit, generating a delay of one half-rate clock pulse, and outputting through-data, thereby converting phase comparison polarity in the half-rate phase detector, and a second exclusive OR circuit which receives the re-timed signal from the selector circuit and the though-data from the one-pulse delay circuit and outputs, in response, an output signal, wherein the voltage controlled oscillator is an N type LC voltage controlled oscillator for operation with the phase comparison polarity inversion produced by the one-pulse delay circuit.

2. The half-rate CDR circuit according to claim 1, wherein gate size of the one-pulse delay circuit of the half-rate phase detector is variable for adjustment of the delay of one pulse in the one-pulse delay circuit.

3. The half rate CDR circuit according to claim 1, wherein wiring length of the one-pulse delay circuit of the half rate phase detector is variable for adjustment of the delay of one pulse in the one-pulse delay circuit.

4. The half rate CDR circuit according to claim 1, including a plurality of pump-up bias circuits having different gate bias levels, respectively, for a pump-up constant current source of the charge pump circuit and for changing current quantity of the pump-up constant current source upon switching of the pump-up bias circuits, for adjustment of the delay of one pulse in the one-pulse delay circuit.

5. The half rate CDR circuit according to claim 1, including a plurality of pump-down bias circuits having different gate bias levels, respectively, for a pump-down constant current source of the charge pump circuit and for changing current quantity of the pump-down constant current source upon switching of the pump-up bias circuits, for adjustment of the delay of one pulse in the one-pulse delay circuit.

6. The half rate CDR circuit according to claim 4, wherein the number of pump-up constant current sources of the charge pump circuit is changed to change the current quantity of the pump-up constant current sources for adjustment of the delay of one pulse in the one-pulse delay circuit.

7. The half-rate CDR circuit according to claim 5, wherein the number of pump-down constant current sources of the charge pump circuit is changed to change the current quantity of the pump-down constant current sources for adjustment of the delay of one pulse in the one-pulse delay circuit.

* * * * *